(12) United States Patent
Hausmann

(10) Patent No.: US 7,474,135 B2
(45) Date of Patent: Jan. 6, 2009

(54) CIRCUIT FOR DIFFERENTIAL SIGNALS

(75) Inventor: Michael Hausmann, Graz (AT)

(73) Assignee: Infineon Technologies AG, Munich (DE)

( * ) Notice: Subject to any disclaimer, the term of this patent is extended or adjusted under 35 U.S.C. 154(b) by 14 days.

(21) Appl. No.: 11/619,819

(22) Filed: Jan. 4, 2007

(65) Prior Publication Data

US 2007/0176649 A1    Aug. 2, 2007

(30) Foreign Application Priority Data

Jan. 5, 2006    (DE)    ........................ 10 2006 000 902

(51) Int. Cl.
H03K 5/12    (2006.01)
(52) U.S. Cl. ..................... 327/170; 327/112; 327/134; 327/137; 326/30; 326/86
(58) Field of Classification Search ............. 327/13–16, 327/108, 112, 134, 135, 137, 170, 261, 263, 327/265; 326/30, 82, 83, 86, 87
See application file for complete search history.

(56) References Cited

U.S. PATENT DOCUMENTS

| | | | |
|---|---|---|---|
| 5,134,311 A * | 7/1992 | Biber et al. ................. | 327/108 |
| 5,886,554 A | 3/1999 | Corsi et al. | |
| 5,959,492 A | 9/1999 | Khoury et al. | |
| 6,157,215 A * | 12/2000 | Gabara et al. ................. | 326/83 |
| 6,237,107 B1 | 5/2001 | Williams et al. | |
| 6,356,105 B1 * | 3/2002 | Volk ............................ | 326/30 |
| 6,664,811 B1 | 12/2003 | Bridgewater, Jr. | |
| 2003/0210507 A1 | 11/2003 | Pihet et al. | |

FOREIGN PATENT DOCUMENTS

| | | |
|---|---|---|
| DE | 10 2004 024 887 | 12/2005 |
| DE | 10 2004 026 233 | 12/2005 |
| WO | 02065641 | 8/2002 |

* cited by examiner

*Primary Examiner*—An T Luu
(74) *Attorney, Agent, or Firm*—Dicke, Billig & Czaja, PLLC

(57) ABSTRACT

A method and integrated circuit for the transmission of differential signals with a signal and a complementary signal is disclosed. For trimming the edge steepness of the signal with that of the complementary signal, the integrated circuit has a first driver for generating the signal, and a second driver for generating the complementary signal. A circuit is provided, configured to control the edge steepness of the signal or of the complementary signal.

26 Claims, 3 Drawing Sheets

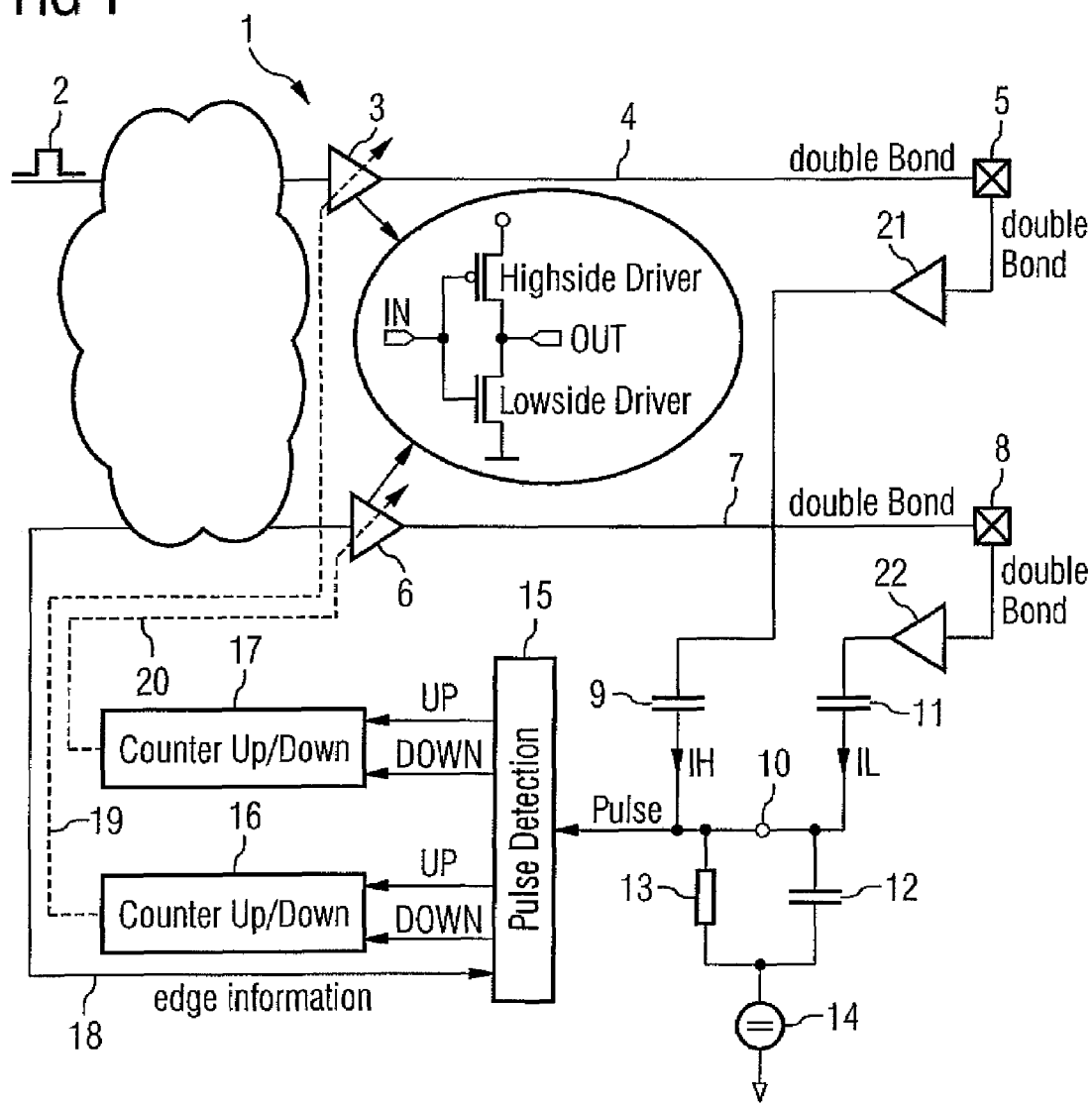

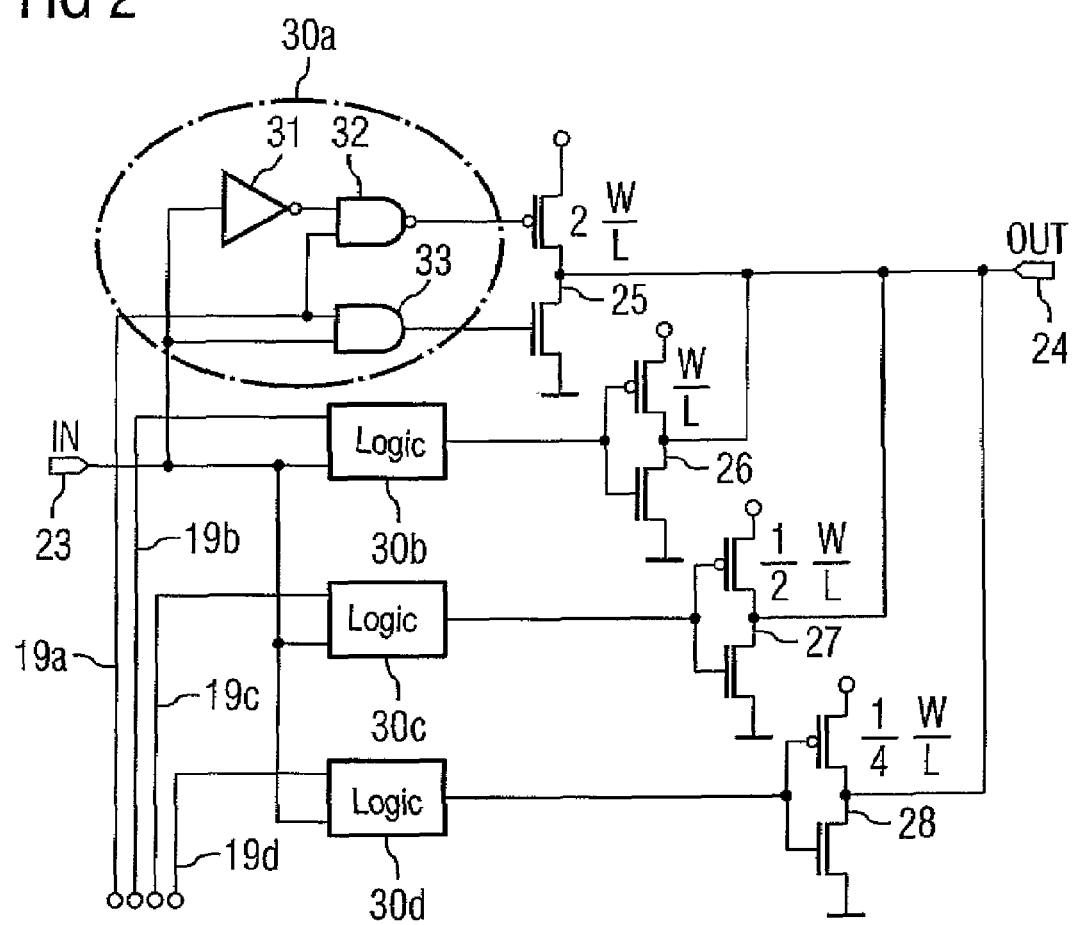

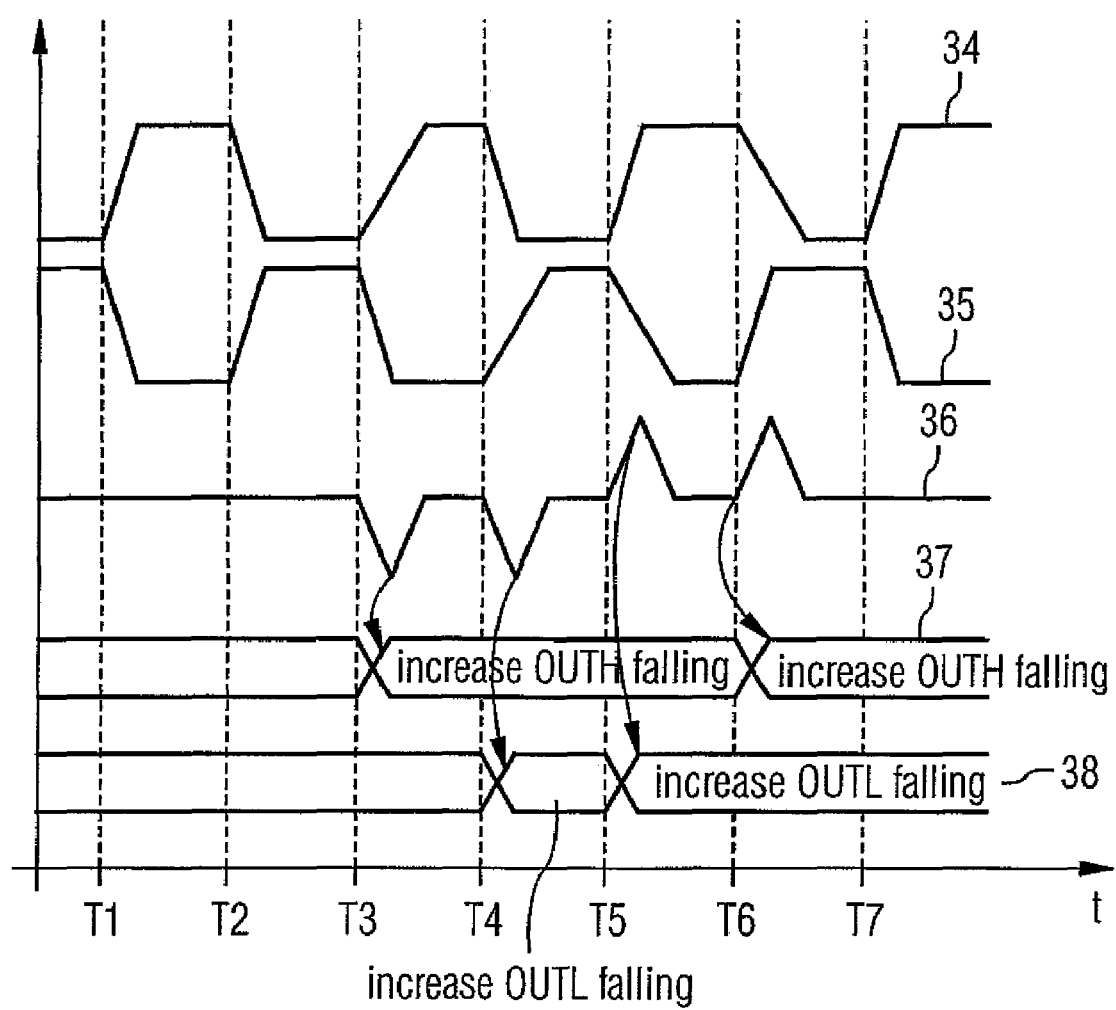

CIRCUIT FOR DIFFERENTIAL SIGNALS

CROSS-REFERENCE TO RELATED APPLICATIONS

This Utility Patent Application claims priority to German Patent Application No. DE 10 2006 000 902.9 filed on Jan. 5, 2006, which is incorporated herein by reference.

BACKGROUND

The invention relates to a method and a driver circuit for the transmission of differential signals.

For the transmission of digital data by electric signals, differential busses, for instance, the CAN bus known from the automotive field, are frequently used.

In a differential bus, the digital signal to be transmitted is transmitted on a transmission line, and the complementary signal on a second, parallel line. The transmission by a differential bus offers advantages vis-à-vis a single-ended transmission in which only the signal is transmitted via a line and the receiver uses GND as reference potential, or a transmission with one signal and one reference potential line. Perturbations by foreign electromagnetic fields influence both transmission lines in equal or similar manner during the differential transmission. Since the difference of the transmitted signals is generated at the receiver side for retrieval of the desired signal, the perturbations are at least partially eliminated, so that the differential transmission of a digital signal is less sensitive to perturbations by foreign fields.

Another advantage of a differential bus is the minor radiation of electromagnetic fields that may have an interfering effect on other data transmission lines. In the ideal case, i.e. if the signals are exactly complementary to each other, no electromagnetic field is radiated by the conductors altogether since the field radiated by a conductor is exactly complementary to that of the other conductor, and they therefore cancel each other out.

In differential bus systems, the two signals are, however, frequently not ideally complementary to each other, so that undesired fields are radiated. Thus, in the case of not ideally complementary signals there results a common-mode portion that causes the radiation.

The greatest voltage changes as well as peaks in the current flow are caused by an edge in a digital signal. Here, it has to be taken into account that, in an ideal system, a signal edge has an infinite rise, but that in practice, due to the non-ideal characteristics of electronic devices, the rise of a signal edge is finite. Thus, the intensity of an electromagnetic field radiated by the conductors of a differential bus depends, in addition to the simultaneousness of the signal edges, in particular on the edge steepness of the signals.

For reducing or for preventing the radiation of an undesired electromagnetic field by the conductors of a data transmission path, the bus drivers feeding the signals that are complementary to each other into the lines therefore have to be designed such that they generate signals having an edge steepness as equal as possible. For the design of circuits by which the edge steepness can be influenced, it has to be taken into account that, for the bus driver of the high level signal, e.g., P-MOS transistors are used, and for the bus driver of the complementary signal e.g., N-MOS transistors.

For the design of circuits for controlling, fuses are used in accordance with prior art, i.e. thin, metal conductor paths that are adapted to be cut through by a laser and by which a trimming of the bus drivers can be performed once only during manufacturing.

U.S. Pat. No. 5,886,554 describes a circuit of a driver which enables the controlling of the edge steepness, wherein the edge steepness of the rising signal edge is adapted to be controlled independently of the edge steepness of the falling signal edge. The edge steepness is respectively controlled in that a current is conducted through a capacitance, so that the voltage and thus the edge steepness of the voltage rise may be controlled via the current intensity and the size of the capacitance. By a switch switched in the cycle of the signal to be transmitted, the current flow is conducted, at the rising edge, through a first, and at the falling edge through a second capacitance, which may be dimensioned irrespective of each other, and thus the respectively separate controlling of the edge steepness is enabled. For controlling the edge steepness of the signal and of the complementary signal, the described circuit is connected in the signal path of the signal and in the signal path of the complementary signal.

These approaches for trimming the steepness of the signal edges with those of the complementary signal have the disadvantage that the dimensioning of the devices used is determined once only, or a trimming can take place once only. Fluctuations in the characteristics of the devices controlling the steepness of the signal edges, which are, for instance, caused by aging or temperature fluctuations, thus cannot be compensated for during the operation of the drivers.

For these and other reasons, there is a need for the present invention.

SUMMARY

One embodiment provides a method and to an integrated circuit for the transmission of differential signals with a signal and a complementary signal. For trimming the edge steepness of the signal with that of the complementary signal, the integrated circuit includes a first driver for generating the signal, and a second driver for generating the complementary signal. A circuit is provided, configured to control the edge steepness of the signal or of the complementary signal as a function of the sum signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic representation of a driver circuit in accordance with an embodiment of the invention.

FIG. 2 illustrates a schematic exemplary representation of a bus driver of the driver circuit.

FIG. 3 illustrates a schematic exemplary representation of signal progressions occurring in the driver circuit.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides an integrated circuit, a novel driver circuit and a novel signal transmission method, in particular a circuit and a method which enable the trimming of the edge steepness of the signal with that of the complementary signal during operation, so that fluctuations during the operation of the bus drivers can be compensated for.

In accordance with an embodiment of the invention there is a driver circuit for the transmission of differential signals with a signal and a complementary signal, wherein the driver circuit has a first trimmable bus driver for generating the signal and a second trimmable bus driver for generating the complementary signal, wherein the signal and the complementary signal are tapped prior to being fed into corresponding conductors, and wherein the edge steepness of the signal and/or of the complementary signal is controlled as a function of a signal obtained from the signal and the complementary signal.

In the case of ideal differential signals, the edges of the signals coincide in time, with a rising edge of a signal corresponding to a falling edge of the respective other signal. By the addition of a time derivation of the signal with the time derivation of the complementary signal there results thus a sum signal that is constant in the ideal case. If the edge steepness of the two signals is, however, not equal, the sum signal has a deviation from the constant value on addition of the edges. This deviation is evaluated by the control unit that generates trimming signals for controlling the first or the second bus driver, respectively, and thus controls the bus drivers such that the edge steepness of the signal includes the same amount as the edge steepness of the complementary signal.

FIG. 1 illustrates a schematic representation of a driver circuit 1 in accordance with an embodiment of the invention, which may be realized as a component of an integrated circuit, i.e. a IC, on a semiconductor chip.

The driver circuit 1 generates a differential signal from a digital input signal 2 which is fed to the driver circuit 1 from a source that is not illustrated. The digital input signal 2 is, to this end, fed within the driver circuit 1 to a first bus driver 3 that amplifies, in the embodiment described here, the digital input signal to a corresponding signal. This signal oscillates between two voltage levels, the higher of which represents a first logic state, e.g., logic 1, and ranges, in the present embodiment, above the voltage levels of a corresponding complementary signal. The lower voltage level represents the other logic state, i.e. logic 0 here, and is, in the present embodiment, at least as high or equally as high as the higher voltage level of the complementary signal. The signal is fed, via a first bonding wire 4, from a contact pad of the first bus driver 3 to a first output pin 5 of the semiconductor chip.

For generating the signal complementary to the signal, the digital input signal 2 fed to the driver circuit 1 is inverted and transmitted to a second bus driver 6, so that the second bus driver 6 generates a signal complementary to the signal—here called complementary signal—with lower voltage levels (in the present embodiment) than with the signal complementary to the complementary signal. The complementary signal thus oscillates between two voltage levels, the lower of which represents the first logic state, i.e. logic 1 here. The complementary signal is, via a second bonding wire 7, fed from a contact pad of the second bus driver 6 to a second output pin 8 of the semiconductor chip.

In the embodiment described here, for instance, for the CAN bus, the signal oscillates between 2.5 volts and 5 volts, so that, in the first logic state, the voltage is 5 volts, and in the second logic state correspondingly 2.5 volts. The voltage of the complementary signal oscillates between 2.5 volts and 0 volt, so that, in the first logic state, a logic 1, the voltage of the complementary signal is 0 volt, and otherwise, i.e. with logic 0, correspondingly 2.5 volts.

If the signal and the complementary signal were ideal, the amount of the edge steepness would be equally large in the case of a signal change. In the case of a signal change from logic 0 to 1, the complementary signal would fall from 2.5 volts to 0 volt as quickly as the signal would rise from 2.5 volts to 5 volts. Correspondingly, in the case of a signal change from logic 1 to 0, the complementary signal ideally would rise from 0 to 2.5 volts as quickly as the signal would fall from 5 volts to 2.5 volts.

Since, in particular with a signal change from 0 to 1, or from 1 to 0, current flows through the conductors, the electromagnetic field radiated by the conductors is particularly large during the period of the respective voltage changes. In the case of ideal signals, the electromagnetic fields do, however, cancel out each other since, in the case of a signal change, the current directions in the signal conductors and thus also the induced electromagnetic fields are complementary to each other.

In the case of known bus drivers, the differential signals are, however, not ideally complementary to each other, so that the electromagnetic fields of the signal and of the complementary signal do not cancel each other out exactly and an electromagnetic field exists in the case of a signal change. Such an electromagnetic field is undesired since it causes induction currents in metal conductors which may be the reason for further perturbations. In particular may such undesired electromagnetic fields induce currents in adjacent lines which may result in perturbations in the respective system. Furthermore, as a function of the frequency of the generated electromagnetic fields, they may also intersperse in a radio and jam reception, which is, for instance, undesired when using the CAN bus in automotive construction.

The different edge steepnesses of signal and complementary signal may, for instance, be ascribed to the fact that P-MOS transistors are, for instance, used for the power transistors of the bus drivers of the high level signal, and N-MOS transistors are, for instance, used for the power transistors of the complementary signal. This lends itself in particular in CMOS technology. These differences may indeed be compensated for during the designing and the manufacturing of the driver circuit by appropriate measures. Aging and temperature do, however, have different influences on the characteristics of the transistors in the bus drivers, so that this may cause deviations in the edge steepness.

For avoiding different edge steepnesses, the first bus driver 3 and the second bus driver 6 are configured to be trimmable, so that the edge steepness of the signals generated is controllable. Since the edge steepness is determined by the power of a transistor, i.e. its relationship of width to length of the conductive channel, this relationship may be adjusted by connecting several transistors in parallel. The power of a transistor may thus, for instance, be controlled in that a major or minor number of transistors are connected in parallel, so that the widths add up, for instance, with equal length of the conductive channels. Thus, the power of a transistor and hence the edge steepness of a signal generated may be increased or reduced in that a major or a minor number of transistors are connected or operated in parallel. This may be realized for a power stage of a bus driver, for instance, in that a plurality of transistors is connected in parallel, which may be activated or deactivated by upstream switches.

The trimmable bus drivers 3, 6 are trimmed or adjusted via signals, in the following referred to as trimming signals, such that the edge steepness of the signal and of the complementary signal is equal.

For determination of the trimming signals, the signal is, prior to its feeding into a signal conductor, tapped outside the semiconductor chip, i.e. before or at a pin (e.g., the pin 5) of the semiconductor chip and transmitted to a node 10 via a first capacitance 9. The complementary signal is also tapped before or at a pin (e.g., the pin 8) of the semiconductor chip and transmitted to the node 10 via a second capacitance 11. A change of the voltage of the signal thus causes a change of the voltage present at the first capacitance 9 and a corresponding current flow. Equally, a change of the voltage of the complementary signal causes a corresponding change of the voltage present at the second capacitance 11 with a corresponding current flow.

Since the current through a capacitance corresponds to the first time derivation of the pertinent voltage, the first time derivation of the signal or of the complementary signal, respectively, is determined by means of the first capacitance 9 and the second capacitance 11. At the node 10, the first time derivation of the signal and the first time derivation of the complimentary signal are thus added to a sum signal.

In the case of ideal complementary signals—provided that the first and the second capacitances are of equal size—, the currents generated by the change of voltage of the signal and of the complementary signal are of equal intensity, so that they cancel each other out, or that a charge shift from one capacitance to the other one takes place, respectively.

The node 10 is further connected with a discharge resistor 13 with a reference potential by a parallel connection of a third capacitance 12. The reference potential is to be chosen such that a pulse generated at the node 10 by charging the third capacitance 12 is detectable vis-à-vis the reference potential. The reference potential may be realized by a voltage source 14. In the present embodiment, for instance, for the CAN bus in which the signal oscillates between 2.5 and 5.0 volts and the complementary signal between 2.5 and 0 volts, the reference potential may be chosen at 2.5 volts and is realized by the voltage source 14.

In the case that, with a signal change from logic 0 to 1 or vice versa, the edge steepness of the complementary signal is not exactly complementary to the edge steepness of the signal, no exact charge shift takes place between the first 9 and the second capacitances 11, but part of the current charges the third capacitance 12. This current flow thus generates a voltage peak or a voltage pulse, respectively, at the node 10. Via the discharge resistor 13, the third capacitance 12 is subsequently discharged.

The sensitivity of or the time constant for the discharging process of the third capacitance 12 is determined by the size of the discharge resistor 13 and the size of the capacitance 12. The capacitance 12 and the discharge resistor 13 are dimensioned such that the time constant of the system, i.e. of the RC element 12, 13, is smaller than half of the minimally occurring period duration of the signal or of the complementary signal, respectively.

A voltage pulse at the node 10 is detected by the pulse detector 15 that is connected with the node 10 and is transmitted to a first counter 16 that is connected with the first bus driver 3, or to a second counter 17 that is connected with the second bus driver 6. The first or the second counter 16, 17 generates trimming signals that are transmitted to the first bus driver 3 or the second bus driver 6.

The trimming signals for the first bus driver 3 are transmitted, via one or several lines or a connection 19, respectively, to the first bus driver 3; correspondingly, the signals for the second bus driver 6 are signalized via one or several lines or a connection 20, respectively. The trimming signals cause a trimming of the edge steepness in the bus drivers 3 and 6 in the case of a signal change, so that the edge steepness of signal and complementary signal is, in the ideal case, of equal amount, but complementary.

For increasing the edge steepness of a signal, the number of transistors that are connected in parallel in a bus driver 3, 6 may be increased. Correspondingly, for reducing the edge steepness, the number of transistors that operate in parallel may be reduced.

For differentiating the direction in which a bus driver 3, 6 is to be trimmed, i.e. whether the number of transistors that are connected in parallel is to be increased or to be reduced, the pulse detector 15 obtains information about whether the detected voltage pulse has occurred with a rising or a falling edge of the signal or the complementary signal. To this end, the pulse detector 15 is supplied with the digital input signal or the signal or the complementary signal (e.g., via a line 18).

If the edge steepness of that signal is larger which oscillates to a higher voltage, a positive voltage pulse will be generated at the node 10, i.e. a voltage peak that deviates upwards from the reference potential. This is the case if, with a change of signal from logic 0 to 1, the edge steepness of the signal is larger than that of the complementary signal or, with a change of signal from logic 1 to 0, the edge steepness of the complementary signal that oscillates from 0 to 2.5 volts, is larger than that of the signal. In these cases, a shifting current does not only flow from that capacitance 9, 11 that is connected to the signal of the minor edge steepness to the capacitance 9, 11 that is connected with the signal of the larger edge steepness, but a current portion also flows to the third capacitance 12, so that a positive voltage pulse is generated at the node 10.

Vice versa, i.e. if the edge steepness of a falling signal is larger than that of the rising signal, a negative pulse is generated at the node 10. This is the case if the signal falls from 5 to 2.5 volts with a larger edge steepness than the complementary signal rises from 0 to 2.5 volts, or if the complementary signal falls more quickly from 2.5 to 0 volts than the signal rises from 2.5 to 5 volts.

If the pulse detector 15 thus detects a voltage pulse, it may decide, on the basis of the direction of the pulse and the information supplied via the line 18, namely in which situation the pulse was generated, whether further transistors have to be connected in parallel with the first bus driver 3 of the signal or with the second bus driver 6 of the complementary signal so as to correspondingly increase the edge steepness of one of the signals, or whether—if the number of the active transistors of a bus driver cannot be further increased—the number of the active transistors of the respectively other bus driver has to be reduced.

The pulse detector 15 thus forms, along with the third capacitance 12 and the discharge resistor 13 as well as the counters 16 and 17, a control unit. The respective first time derivations are formed of the signal and of the complementary signal, which are added to a sum signal. The sum signal is transmitted to the control unit which evaluates this sum signal by taking into account e.g., the input signal, and generates trimming signals by which the trimmable bus drivers 3 and 6 can be influenced such that the edge steepness of the signal is exactly complementary to the edge steepness of the complementary signal.

In the present embodiment, the signal and the complementary signal can be tapped via a respective bonding wire at the corresponding pin (e.g., the pins 5, 8) of the semiconductor chip and each be returned separately. Both the signal and the complementary signal are thus transmitted via a respective separate bonding wire (e.g., the bonding wires 4, 7) from the contact pad of the respective bus driver 3, 6 to a pin (e.g., the pins 5, 8) of the semiconductor chip, and from there each returned via a further bonding wire. The returning via a separate bonding wire causes the processing of the actual signal or of the complementary signal, respectively, as they are present at the pins 5, 8 of the chip.

Furthermore, the signal and the complementary signal can be tapped each via an operational amplifier. The returned signal is thus first supplied to a first operational amplifier 21 and then to the first capacitance 9. In analogy, the complementary signal is first supplied to a second operational amplifier 22 and then to the second capacitance 11. The operational amplifiers 21, 22 ideally have an infinite input resistance. At their respective output, the operational amplifiers 21, 22 provide the voltage present at their input, with this voltage also being maintained when a current flows. Thus, the operational amplifiers 21, 22 each serve as impedance converters that prevent a corruption of the signal and of the complementary signal.

Furthermore, in one embodiment, the logic of the counters 16, 17 is designed such that, with a trimming of the edge steepnesses, in one embodiment the signal with the minor edge steepness is modified such that it subsequently has a larger edge steepness so as to keep the time required for the signal transitions small. It is, however, predetermined that a maximum edge steepness is not exceeded, so that respective threshold values are predefined for the amounts of the edge steepnesses.

FIG. 2 illustrates a schematic exemplary representation of a bus driver 3. The digital input signal 2 to be transmitted is fed in via a bus driver input 23 and is then output as signal via a bus driver output 24 and—not illustrated here—transmitted via the above-mentioned bonding wire 4 to the corresponding pin of the semiconductor chip. The bus driver 3 includes several P-MOS/N-MOS transistor pairs 25, 26, 27, and 28 which serve to amplify the digital input signal.

The powers of the transistor pairs are dimensioned differently. In one embodiment, the transistor pair 25 has a power of 2 W/L, wherein W/L indicates the relationship of width to length of the conducting transistor channel, the transistor pair 26 has a power W/L, the transistor pair 27 a power of ½ WL, and the transistor pair 28 a power of ¼ W/L, so that the transistor powers are weighted in a binary manner. Thus, with a process width of ¼ W/L, a total driver power in the range of between ¼ and 3¾ W/L can be adjusted.

Via lines 19a to 19d, the trimming signals which the counter 16 generates and signalizes via the connection 19 are signalized to the bus driver 3, so that the connection 19 is here illustrated by the individual lines 19a to 19d. The trimming signal transmitted via the lines 19a to 19d may, for instance, correspond to the respective digital counter reading of the counter 16.

Via the lines 19a to 19d and corresponding logic circuits 30a to 30d it can be controlled which transistor pairs are to be active. Such a logic circuit—here the logic circuit 30a—is illustrated in more detail in the circuit diagram that is defined by a dotted line.

If the digital signal 2 is fed in via the input 23 of the bus driver 2, it is, on the one hand, inverted by means of an inverter 31 provided in the corresponding logic circuit 30a, and subsequently transmitted to a NAND gate 32. On the other hand, the digital signal is directly transmitted to an AND gate 33 provided in the corresponding logic circuit 30a. Both the NAND gate 32 and the AND gate 33 each have a trimming signal—that is supplied via a corresponding one of the lines 19a-19d—as second input signal which was generated by the corresponding counter 16, 17. The output of the NAND gate 32 is connected with the gate of the P-MOS transistor, and the output of the AND gate 33 is connected with the gate of the N-MOS transistor of the transistor pair 25. The digital input signal 2 is thus only transmitted to the downstream transistor pair 25 if a logic 1 (HIGH level) is present at the corresponding line 19a that is connected with the corresponding logic circuit 30, so that the NAND gate 32 and the AND gate 33 connect through the digital input signal 2 or the inverted digital input signal, respectively.

FIG. 3 schematically illustrates the time progressions of the signal 34 and of the complementary signal 35 as well as of the sum voltage 36 at the node 10, and of the trimming signals 37, 38 generated by the counters 16, 17. The trimming signals 37, 38 are here represented by two respective lines symbolizing a respective binary word, wherein a modification of the word content is illustrated by a crossing of the two lines.

The voltages of the signals are not plotted to scale on the Y-axis. Thus, for instance, the signal 34 and the complementary signal 35 have the same voltage at logic 0, but this has not been plotted such for reasons of clarity. Likewise, the absolute values of the voltages of the sum voltage signal 36 cannot be gathered from the illustration since only the context with respect to time and principle between the signal progressions has been illustrated here.

At the points in time $t=T_1$ to $T_7$, a respective change of the logic state of the signal or of the complementary signal, respectively, takes place, so that the signal 34 and the complementary signal 35 each change their voltage. Here, it is assumed that the beginning of the voltage change of the signal 34 coincides in time with the beginning of the voltage change of the complementary signal 35.

At the point in time $t=T_1$, a change from logic 0 to logic 1 takes place, so that the voltage of the signal 34 rises from 2.5 to 5.0 volts and the voltage of the complementary signal 35 falls from 2.5 to 0 volts. For better illustration, the respective initial value of the voltages has not been drawn to be one upon the other. The edge steepness of the voltage drop of the complementary signal 35 is complementary to the edge steepness of the voltage rise of the signal 34. At the node 10, this causes a shifting current from the first capacitance 9 to the second capacitance 11, wherein the second capacitance 11 takes up, at each point in time, exactly the amount of charge that flows off the first capacitance 9. Consequently, no current flows to the third capacitance 12, so that it is not charged and no voltage pulse is generated at the node 10.

A change from logic 1 to 0 takes place at the point in time $t=T_2$. Correspondingly, the voltage of the signal 34 falls and the voltage of the complementary signal 35 rises. The edge steepnesses of both signals again have the same amount, so that no voltage pulse is generated at the node 10 and the trimming signals 37, 38 generated by the counters 16, 17 remain equal.

At the point in time $t=T_3$, the next signal change from logic 0 to 1 starts, so that the voltage of the signal 34 rises and that of the complementary signal 35 falls, wherein the rise of the signal 34 has a minor edge steepness than the fall of the complementary signal 35. During the time during which the complementary signal 35 falls, the voltage 36 at the node 10 decreases since the third capacitance 12 is charged negatively. The voltage 36, however, rises again to the reference potential as soon as the complementary signal 35 has reached the level of the new logic state, while the signal 34 rises even further. This way, a negative pulse is generated at the node 10 during the duration of the signal rise or fall, respectively. This pulse is detected by the pulse detector 15. Simultaneously, the pulse detector 15 obtains, via the line 18, the information at which logic signal change the pulse occurred. In the present case, the pulse is accordingly transmitted to the first digital counter 16, so that it increases its counter reading and sets or modifies, respectively, the trimming signal 37 at its output and via the connection 19, so that the intensity of the first bus driver 3 of the signal 34 is increased. This effects that the edge steepness of the signal 34 is larger at the next rise. The trimming signal 38 for the second bus driver 6 remains unchanged.

During the following change of the signal from logic 1 to 0 at the point in time $t=T_4$, the edge steepness of the first signal 34 is larger than that of the complementary signal 35. Again, a negative pulse is generated at the node 10, which is detected by the pulse detector 15. For trimming the edge steepnesses, the edge steepness of the complementary signal 35 now has to be increased, so that the trimming signal 38—by incrementing the counter 17—is changed such that the intensity of the second bus driver 6 of the complementary signal 35 is increased. The trimming signal 37 for the first bus driver 3 remains unchanged.

During the following signal change from logic 0 to 1 at the point in time $t=T_5$, the edge steepness of the signal 34 is larger than that of the complementary signal 35. In this case, a positive voltage pulse is generated at the node 10, which is detected by the pulse detector 15 and transmitted to the digital counter 17, so that it changes its output signal, i.e. the trimming signal 38, correspondingly. This again increases the intensity of the second bus driver 6, so that the edge steepness of the complementary signal 35 is increased. The trimming signal for the first bus driver 3 remains unchanged.

During the next signal change at the point in time $t=T_6$, the edge steepness of the complementary signal 35 is larger than that of the signal 34, so that the voltage of the complementary signal 35 rises more quickly than that of the signal 34 falls. This generates a positive pulse of the voltage 36 at the node 10. Since in this case the edge steepness of the signal 34 is to be increased, the pulse is transmitted to the first digital counter 16, so that, by means of the correspondingly changed trimming signal 37, the intensity of the first bus driver 3 is increased in that a further pair of transistors is connected in parallel.

This way, during each logic signal change at the first and the second bus drivers 3, 6 it is measured whether the edge steepness of the complementary signal 35 is actually complementary to the edge steepness of the signal 34. If a deviation is detected, the intensity of the trimmable bus drivers 3, 6 is modified step by step until the edge steepnesses are of equal amount. In so doing, it has to be taken into account that the edge steepness of a bus driver 3, 6 can only be increased to a predetermined threshold value. If the maximum intensity of a bus driver 3, 6 has been reached, i.e. all transistor pairs 25 to 28 already operate in parallel, the intensity of the respectively other bus driver may be reduced, so that the edge steepness of one signal can be adapted to that of the other one this way.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a first driver configured to generate a signal;
   a second driver configured to generate a complementary signal; and
   a circuit configured to control an edge steepness of the signal or the complementary signal as a function of an output signal obtained from the signal and the complementary signal, wherein the signal is returned, via a first return line and a first capacitance, to a node, and the complementary signal is returned, via a second return line and a second capacitance, to the node.

2. The circuit according to claim 1, comprising:
   a control unit; and
   a time derivative circuit unit for generating the output signal obtained from the signal and the complementary signal, the first time derivation of the signal and the first time derivation of the complementary signal are added to a sum signal, and wherein the sum signal is supplied to the control unit.

3. The circuit according to claim 1, comprising wherein the node is, via a parallel connection of a discharge resistor, connected with a third capacitance with a reference potential, and wherein the control unit for tapping the sum signal is connected with the node.

4. The circuit according to claim 1, comprising wherein the first driver and the second driver each comprise a parallel connection of transistor pairs of the same type as a power stage.

5. The circuit according to claim 4, comprising wherein the transistor pairs of a driver each have different driver intensities.

6. The circuit according to claim 5, comprising wherein the driver intensities of the transistor pairs are binary-weighted.

7. The circuit according to claim 2, wherein the control unit comprises:
   a pulse detector configured to evalute the sum signal; and
   a first digital counter for controlling the first driver, and a second digital counter for controlling the second driver, wherein the first and the second digital counters are each connected with the pulse detector.

8. The circuit according to claim 3, comprising wherein the parallel connection of the discharge resistor and of the third capacitance is connected with a voltage source.

9. The circuit according to claim 3, comprising wherein the third capacitance and the discharge resistor are dimensioned such that the time constant for the discharging of the third capacitance is smaller than half of the minimally occurring period duration of the signal.

10. The circuit according to claim 1, comprising wherein the first and the second return lines each comprise an operational amplifier connected upstream of the respective capacitance.

11. The circuit according to claim 1, comprising:
    a semiconductor chip.

12. The circuit according to claim 11, comprising wherein the circuit is formed on the semiconductor chip, and wherein the signal is, via a first bonding wire, and the complementary signal is, via a second bonding wire, transmitted from a contact pad of the respective driver to a connection pin of the semiconductor chip, and wherein the signal and the complementary signal are each returned, via a separate bonding wire, from the respective connection pin to a separate contact pad.

13. The circuit according to claim 1, comprising where the first driver and the second driver are trimmable bus drivers.

14. A driver circuit for transmitting differential signals with a signal and a complementary signal, the driver circuit comprising:
a first trimmable bus driver for generating the signal;
a second trimmable bus driver for generating the complementary signal; and
a circuit configured to tap the signal and the complementary signal prior to being fed into corresponding conductors, and an edge steepness of the signal or the complementary signal is respectively controlled as a function of a signal obtained from the signal and the complementary signal, wherein the signal is returned, via a first return line and a first capacitance, to a node, and the complementary signal is returned, via a second return line and a second capacitance, to the node.

15. The driver circuit according to claim 14, comprising:
a control unit; and
a time derivative circuit unit for generating the output signal obtained from the signal and the complementary signal, the first time derivation of the signal and the first time derivation of the complementary signal are added to a sum signal, and wherein the sum signal is supplied to the control unit.

16. The driver circuit according to claim 14, comprising wherein the node is, via a parallel connection of a discharge resistor, connected with a third capacitance with a reference potential, and wherein the control unit for tapping the sum signal is connected with the node.

17. The driver circuit according to claim 14, comprising wherein the first bus driver and the second bus driver each comprise a parallel connection of transistor pairs of the same type as a power stage.

18. The driver circuit according to claim 17, comprising wherein the transistor pairs of a bus driver each have different driver intensities.

19. The driver circuit according to claim 18, comprising wherein the driver intensities of the transistor pairs are binary-weighted.

20. The driver circuit according to claim 15, wherein the control unit comprises:
a pulse detector configured to evalute the sum signal; and
a first digital counter for controlling the first bus driver, and
a second digital counter for controlling the second bus driver, wherein the first and the second digital counters are each connected with the pulse detector.

21. The driver circuit according to claim 16, comprising wherein the parallel connection of the discharge resistor and of the third capacitance is connected with a voltage source.

22. The driver circuit according to claim 16, comprising wherein the third capacitance and the discharge resistor are dimensioned such that the time constant for the discharging of the third capacitance is smaller than half of the minimally occurring period duration of the signal.

23. The driver circuit according to claim 14, comprising wherein the first and the second return lines each comprise an operational amplifier connected upstream of the respective capacitance.

24. The driver circuit according to claim 14, comprising wherein the circuit is formed on a semiconductor chip, and wherein the signal is, via a first bonding wire, and the complementary signal is, via a second bonding wire, transmitted from a contact pad of the respective driver to a connection pin of the semiconductor chip, and wherein the signal and the complementary signal are each returned, via a separate bonding wire, from the respective connection pin to a separate contact pad.

25. A method for transmitting differential signals with a signal and a complementary signal, comprising:
tapping the signal and the complementary signal prior to their feeding into corresponding conductors;
controlling an edge steepness of the signal or the complementary signal as a function of a signal obtained from the signal and the complementary signal;
returning the signal via a first return line and a first capacitance to a node; and
returning the complementary signal to the node via a second return line and a second capacitance.

26. An integrated circuit comprising:
a first trimmable driver configured to generate a signal;
a second trimmable driver configured to generate a complementary signal; and
a circuit formed on a semiconductor chip for tapping the signal and the complementary signal prior to being fed into corresponding conductors, and for controlling an edge steepness of the signal or the complementary signal as a function of an output signal obtained from the signal and the complementary signal;
wherein the signal is, via a first bonding wire and the complementary signal is, via a second bonding wire, transmitted from a contact pad of the respective driver to a connection pin of the semiconductor chip, and wherein the signal and the complementary signal are each returned, via a separate bonding wire, from the respective connection pin to a separate contact pad.

* * * * *